United States Patent [19]

Davis et al.

[11] Patent Number: 5,703,536

[45] Date of Patent: Dec. 30, 1997

[54] LIQUID COOLING SYSTEM FOR HIGH POWER SOLID STATE AM TRANSMITTER

[75] Inventors: Alan Merle Davis; Joseph David Blickhan, both of Quincy, Ill.

[73] Assignee: Harris Corporation, Melbourne, Fla.

[21] Appl. No.: 629,343

[22] Filed: Apr. 8, 1996

[51] Int. Cl.⁶ .............................. H03F 3/04; H03F 3/68
[52] U.S. Cl. ........................ 330/289; 330/66; 330/295
[58] Field of Search ................................ 330/65, 66, 67, 330/68, 289, 295, 251; 361/699, 702, 724; 455/128

[56] References Cited

U.S. PATENT DOCUMENTS

| | | | |
|---|---|---|---|
| 4,580,111 | 4/1986 | Swanson | 332/41 |
| 4,873,613 | 10/1989 | Iversen | 330/66 X |
| 5,070,309 | 12/1991 | Swanson | 330/298 |
| 5,113,145 | 5/1992 | Ideler et al. | 330/251 |
| 5,218,322 | 6/1993 | Allison et al. | 330/295 X |
| 5,309,114 | 5/1994 | Swanson | 330/10 |

*Primary Examiner*—Steven Mottola
*Attorney, Agent, or Firm*—Tarolli, Sundheim, Covell, Tummino & Szabo

[57] ABSTRACT

A liquid cooling system cools a plurality of RF power amplifiers utilized in a high power AM broadcast transmitter. Each RF power amplifier includes a thermally conductive block to which the power transistors associated with that amplifier are physically mounted. The heat generated by the power transistors is conductively transferred to the thermally conductive block. A liquid cooled plate comprising a thermal block and coolant pipes running through the thermal block is also provided. The liquid cooled plate is positioned so that the thermal block is in contact with the thermally conductive block of the RF power amplifier. A pump circulates liquid coolant through the coolant pipes. The liquid cooling system cools the power transistors by transferring the heat from the thermally conductive block through the thermal block of the liquid cooled plate to the liquid coolant flowing through the coolant pipes.

13 Claims, 5 Drawing Sheets

LIQUID COOLING SYSTEM FOR HIGH POWER SOLID STATE AM TRANSMITTER

BACKGROUND OF THE INVENTION

An AM broadcast transmitter includes a plurality of solid state RF power amplifiers that are switched ON and OFF as needed to achieve the desired amplitude modulated signal. Such solid state power amplifiers are typically 80% efficient. This means that 15% of the power input to the power amplifiers is dissipated as heat. Because of this heat, it is necessary to cool the RF power amplifiers in order to maintain their temperature within a permissible operating range.

At low power levels, cooling the RF power amplifiers is easily accomplished using an open loop forced air convection cooling scheme. In such a forced air scheme, air is simply blown over the power amplifiers and the generated heat removed by the forced air. When high power level transmitters are required, however, such a forced air convection cooling system is inadequate. For example, in a transmitter consisting of five or six 200 KW power blocks, the requirements of a forced air system have a substantial negative impact on total transmitter cost and overall efficiency. Thus, a cooling system for high power AM broadcast transmitters was needed which would efficiently and cost effectively remove the heat generated by the RF power amplifiers.

SUMMARY OF THE INVENTION

A liquid cooling system apparatus for removing heat generated by a power amplifier includes a thermally conductive block mounted to the power amplifier such that the thermally conductive block dissipates heat generated by the power amplifier. The liquid cooling system further includes a liquid cooled plate having a thermal block and at least one coolant pipe running through that thermal block. The coolant pipe contains a liquid coolant which is pumped by an external pump through the coolant pipe. A means for biasing provides a bias force to the thermally conductive block to bias the thermally conductive block against the thermal block of the liquid cooled plate. The thermally conductive block is biased against the thermal block of the liquid cooled plate so that the heat generated by the power amplifier is conductively transferred from the amplifier to the liquid coolant flowing through the at least one coolant pipe.

BRIEF DESCRIPTION OF THE DRAWINGS

The foregoing and other features of the present invention will become apparent to one skilled in the art to which the present invention relates upon consideration of the following description of the invention with reference to the accompanying drawings, wherein.

DESCRIPTION OF PREFERRED EMBODIMENTS

One application of the present invention is in conjunction with protecting RF power amplifiers employed in an AM broadcast transmitter. An example of such a transmitter is presented in FIG. 1 and takes the form of a digital amplitude modulator such as that illustrated and described in U.S. Pat. No. 4,859,967, which is assigned to the same assignee as the present invention, the disclosure of which is herein incorporated by reference. The discussion which follows is directed to an explanation of the operation of the circuitry shown in FIG. 1 followed by a detailed description of a power amplifier as illustrated in FIGS. 2 and 2A.

Figure 1:
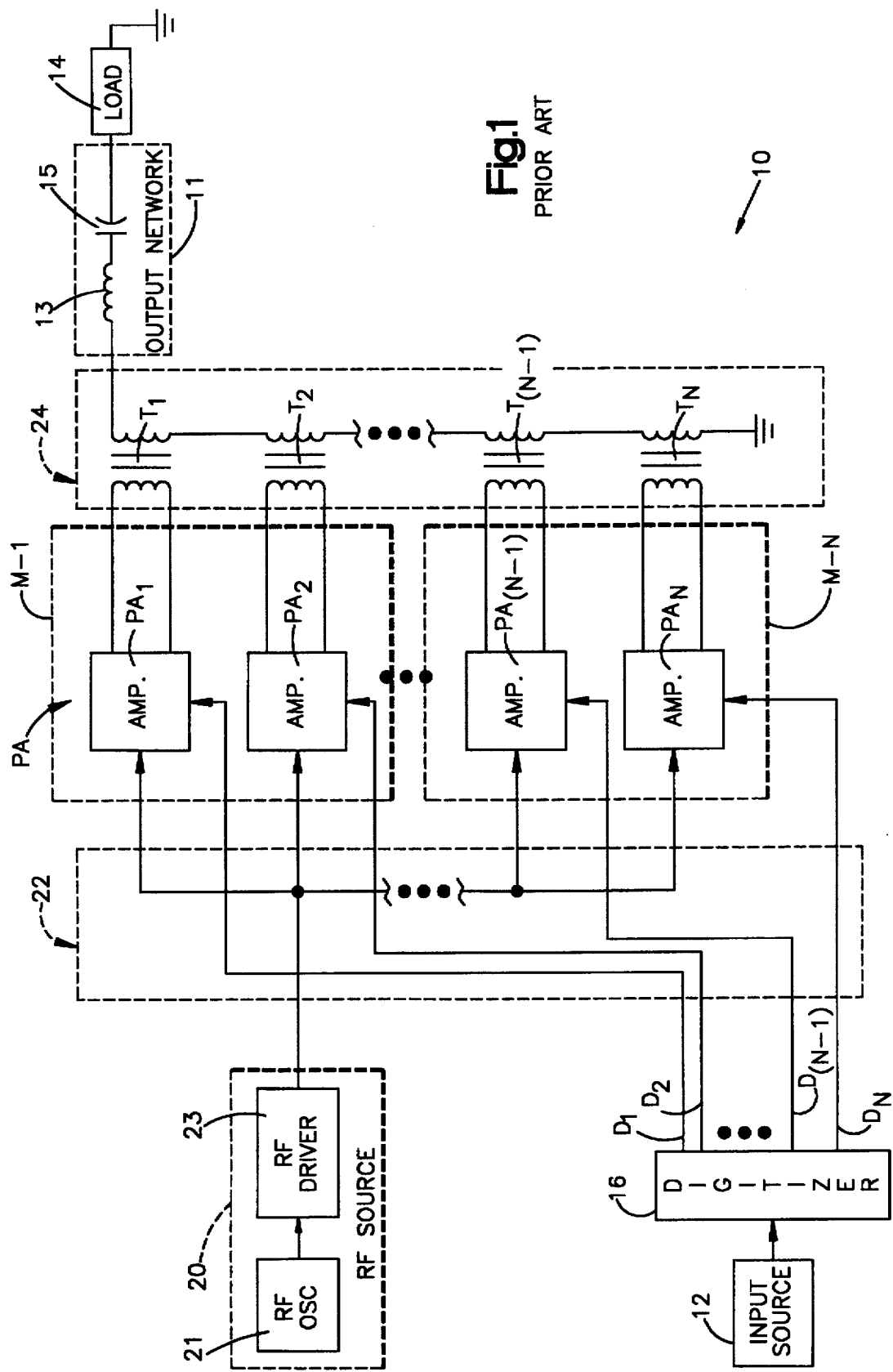
FIG. 1 is a schematic-block diagram illustration of one application to which the present invention may be applied.
Figure 2A:
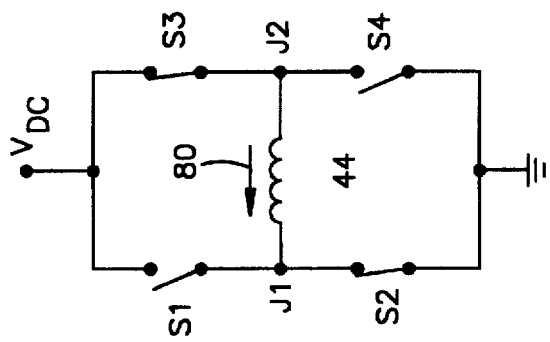
FIG. 2A is a simplified schematic circuit useful in understanding the operation of the circuit shown in FIG. 2.
Figure 2:
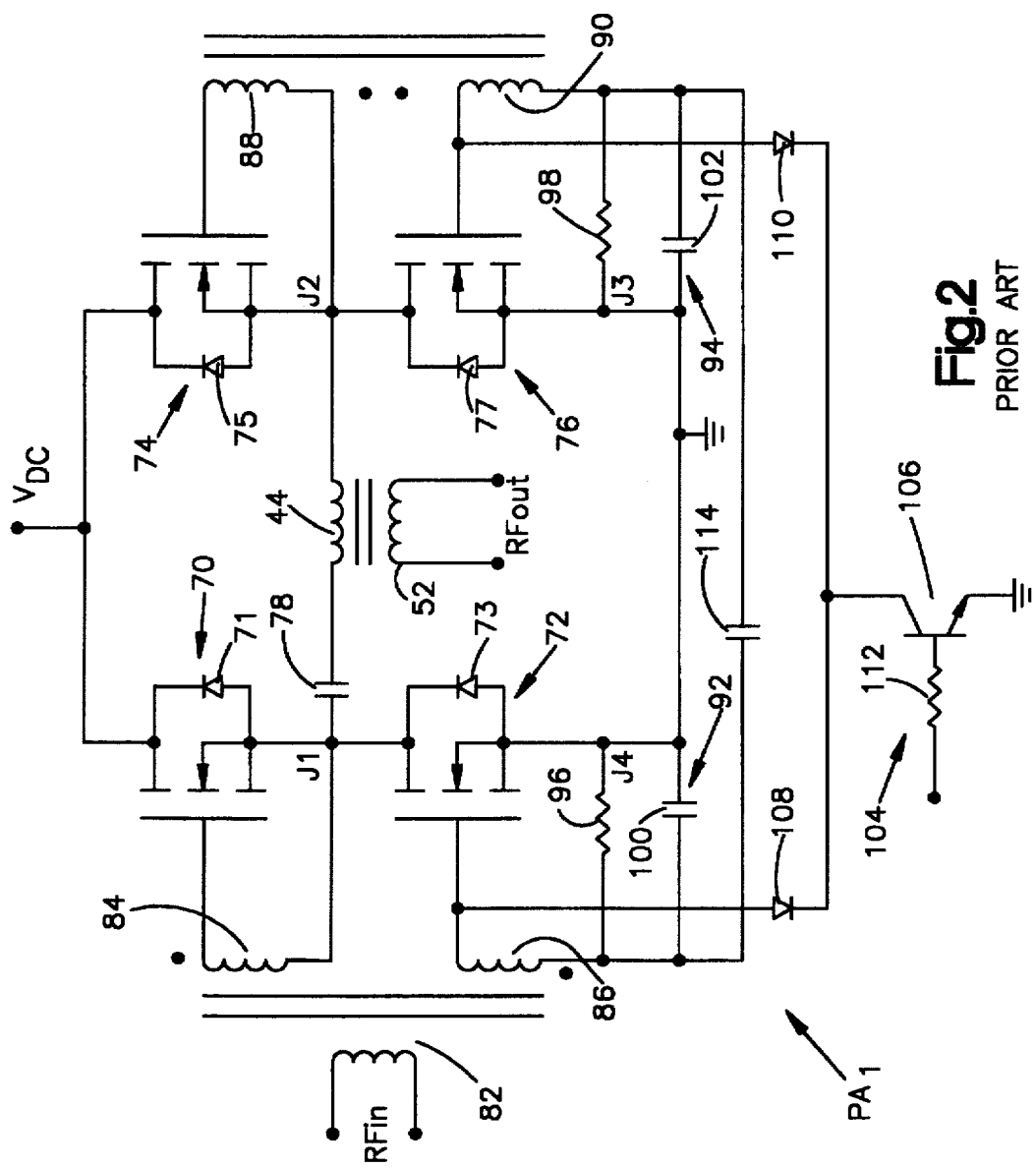
FIG. 2 is a schematic circuit illustration of one of the RF power amplifiers employed in FIG. 1.

Referring now to FIG. 1, the amplitude modulator 10 is illustrated as receiving an input signal from input source 12 which may be the source of an audio signal. Modulator 10 generates an RF carrier signal which is amplitude modulated as a function of the amplitude of the input signal from source 12. The amplitude modulated carrier signal is provided on an output line connected to a load 14, which may take the form of an RF transmitting antenna. A digitizer 16 provides a plurality of digital control signals D1 through DN which have values which vary in accordance with the instantaneous level of the input signal. The control signals are binary signals each having a binary 1 or a binary 0 level. The number of signals having binary 1 or binary 0 levels is dependent upon the instantaneous level of the input signal.

Each of the output controls signals D1–DN is supplied to one of a plurality of N RF power amplifiers $PA_1$–$PA_N$. The control signals serve to turn associated power amplifiers either ON or OFF. Thus, if the control signal has a binary 1 level, then its associated amplifier is inactive and no signal is provided at its output. However, if the control signal is of a binary 0 level, then the power amplifier is active and an amplified carrier signal is provided at its output. Each power amplifier has an input connected to a single common RF source 20. The RF source 20 serves as the single source of an RF carrier signal which is supplied by way of an RF splitter 22 so that each amplifier $PA_1$–$PA_N$ receives a signal of like amplitude and phase and frequency. The carrier signal is amplitude modulated in accordance with the control signals D1–DN and the amplitude modulated carrier signals will be of like frequency and phase. These signals are supplied to a combiner circuit 24 comprised of a plurality of transformers $T_1, T_2, T_3, \ldots, T_N$. The secondary windings act as an independent signal source, whereby the signals provided by the various transformers additively combine with one another to produce a combined signal which is supplied to the load 14. This combined signal hah the same frequency as the RF signal supplied by the RF source 20, but the amplitude of the combined signal is modulated in accordance with the input signal supplied by the input source 12.

As is conventional in such a system, the RF source 20 includes an RF oscillator 21 having a frequency on the order of 500 to 1600 KHz. This oscillator feeds an RF driver 23, the output of which is supplied to the power amplifiers $PA_1$–$PA_N$. The RF driver provides power amplification of the RF signal obtained from oscillator 21 prior to the signal being supplied to the power amplifiers at which modulation also takes place. The RF driver 23 may include several stages of amplification and may be configured similar to the power amplifiers $PA_1$–$PA_N$.

FIG. 2 illustrates one form which the power amplifier $PA_1$ of FIG. 1 may take, the other power amplifiers $PA_2$–$PA_N$ being similar. The power amplifier illustrated includes four semiconductor amplifier elements 70, 72, 74 and 76 connected in a bridge arrangement across a DC power supply voltage of, for example, 250 volts. The primary winding 44 of the associated transformer 36 is connected across the bridge junctions $J_1$ and $J_2$ of the four semiconductor elements.

More particularly, the semiconductor amplifier elements are metal oxide semiconductor, field effect transistors (MOSFETs) having three electrodes, conventionally identified as the gate, drain, and source. The drain-source paths of the transistors 70 and 72, representing their primary current paths, are connected in series across the C power supply, as are the drain-source current paths of transistors 74 and 76. The primary winding 44 of the corresponding combiner transformer $T_1$ is connected in series with a DC blocking capacitor 78 across the common junctions $J_1$ and $J_2$ between transistors 70 and 72 and transistors 74 and 76.

The transistors 70, 72, 74 and 76 effectively operate as switches to connect the two sides of the primary winding 44 to either the DC voltage source or to ground. By proper operation of these transistors, the transformer winding 44 can be connected in either direction across the DC power supply.

This can perhaps be more readily understood by reference to FIG. 2A, which is a simplified illustration of the FIG. 2 circuitry. In FIG. 2A the transistors 70, 72, 74 and 76 are respectively characterized by conventional single pole, single throw switches $S_1$, $S_2$, $S_3$, and $S_4$. As shown in FIG. 2A, the switch $S_1$ is open and the switch $S_2$ is closed, whereby the common junction $J_2$ between them is grounded. The switch $S_3$ is closed and the switch $S_4$ open, however, whereby the junction $J_2$ between those switches is connected to the C supply voltage. Current will, therefore, pass through the primary winding 44 in the direction indicated by the arrow 80.

When all four switches $S_1$–$S_4$ are thrown to their opposite states, current will pass through the output winding 44 in the opposite direction. Thus, when switches $S_1$ and $D_4$ are closed and switches $S_2$ and $S_3$ opened, junction $J_1$ is connected to the DC supply and junction $J_2$ is connected to ground. In this case, the current through the primary winding 44 of the transformer is in a direction opposite to that indicated by arrow 80 of FIG. 2A. An AC signal can thus be applied across the coil 44 by cyclically switching the switches $S_1$–$S_4$ between these two alternate states. If this is done at RF frequencies, then an RF carrier signal results.

Referring back to FIG. 2, the transistor switches 70, 72, 74 and 76 are controlled by signals applied to their gate electrodes. The gate signals for all four transistors are derived from individual secondary windings of a single transformer. This transformer has a toroidal ferrite core with a primary winding 82 and four secondary windings 84, 86, 88 and 90 wound around it. The turns ratio of the transformer is 1:1, whereby the same signal appearing at the primary is applied to each of the circuits connected to the four secondary windings.

Each of the four secondary windings is connected between the gate and source electrodes of an associated one of the MOSFETs 70–76. The secondary 84 is directly connected between the gate MOSFET 70 and junction $J_1$, while secondary 88 is similarly directly connected between the gate of MOSFET 74 and junction $J_2$. The secondary windings 86 and 90 are in like manner connected between the gate and source electrodes of MOSFETS 72 and 76, however in these cases impedance networks 92 and 94 are connected in series with the coils 86 and 90, respectively. Each impedance network 92, 94 includes a parallel combination of a resistor 96, 98 and capacitor 100, 102. The purpose of these impedance networks will be described hereinafter during the description of the amplifier control circuitry 104.

The primary winding 82 of the toroidal transformer is connected to the output of the RF source 20, which provides a sinusoidal RF driving voltage to the power amplifier. Each MOSFET turns "ON" when the RF signal applied to its gate is on its positive half cycle and "OFF" when the applied signal is on its negative half cycle. The MOSFETS therefore cyclically turn ON and OFF at a frequency and phase of the applied RF gate signal. The windings 84 and 90 are connected across MOSFETs 70 and 76 in similar directions whereby the signals appearing at the gates of these transistors are in phase with one another. MOSFETs 70 and 76 therefore turn ON and OFF in unison. Windings 86 and 88, on the other hand, are connected across MOSFETs 72 and 74 in a direction opposite to the direction of connection of the windings 84 and 90. The signals applied to the gates of MOSFETs 70 and 76 are therefore 180° out of phase with respect to the signals applied to the gates of transistors 74 and 72. Consequently, when transistors 70 and 76 are "ON", transistors 72 and 74 are "OFF", and vice versa.

Due to the nonlinear transfer characteristics of the MOSFETs 70, 72, 74 and 76, the MOSFETs will abruptly turn ON and OFF in response to the applied sinusoidal signal, rather than linearly following it. The signal applied across the junctions $J_1$ and $J_2$ will therefore have essentially a squarewave form, though at the frequency of the applied RF input signal. The load 14 to which the output of the combiner circuit 24 of FIG. 1 is connected will generally be frequency selective, and will select only a fundamental component of this squarewave.

As shown in FIG. 2, the power amplifier $PA_1$ includes a switching circuit 104 for turning the power amplifier ON and OFF in response to the control signal appearing on the digitizer output line $D_1$. The switching circuit 104 includes an NPN bipolar junction transistor 106 having its emitter grounded and its collector connected to the gates of MOSFETs 72 and 76 through corresponding diodes 108 and 110. The base of the transistor 106 is connected to the $D_1$ output of the digitizer 24 through a base resistor 112. When the control signal applied to the base resistor 112 has a high logic level (i.e., logic "1"), base current is applied to the transistor 1056, forcing it into a saturation. The gates of the transistors 72 and 76 are then effectively grounded through the corresponding diodes 108 and 110. This has the effect of clamping the gate signals of these transistors to a ground potential, thereby forcing both of them to remain in an "OFF" condition. The primary winding 44 is thus effectively disconnected from ground, thereby turning OFF the power amplifier. When the control signal $D_1$ applied to the emitter resistor 112 has a low logic level (i.e., logic "0"), however, the transistor 106 is cut off and the operation of the amplifier 26 is substantially as described previously.

The resistors 96 and 98 in the gate circuits of MOSFETs 72 and 76 limit the DC current through transistor 106 when it is saturated. Were these not included the current through the transistor 106 would be quite high because the windings 86 and 90 act as voltage sources. The capacitors 100 and 102 bypass the resistors, reducing their effect at RF frequencies. A third capacitor 114 is connected between both capacitors 100 and 102. This capacitor improves the turn-on/turn-off characteristics of the amplifier.

The RF power amplifiers $PA_1$-$PA_N$ that comprise the AM broadcast transmitter previously described are solid state amplifiers. These solid state amplifiers are typically 85% efficient, which means that 15% of the power input to the power amplifiers is dissipated in heat. Because of this heat it is necessary to cool the power amplifiers $PA_1$-$PA_N$ to maintain the temperature of the amplifiers within a permissible operating range.

Figure 3:
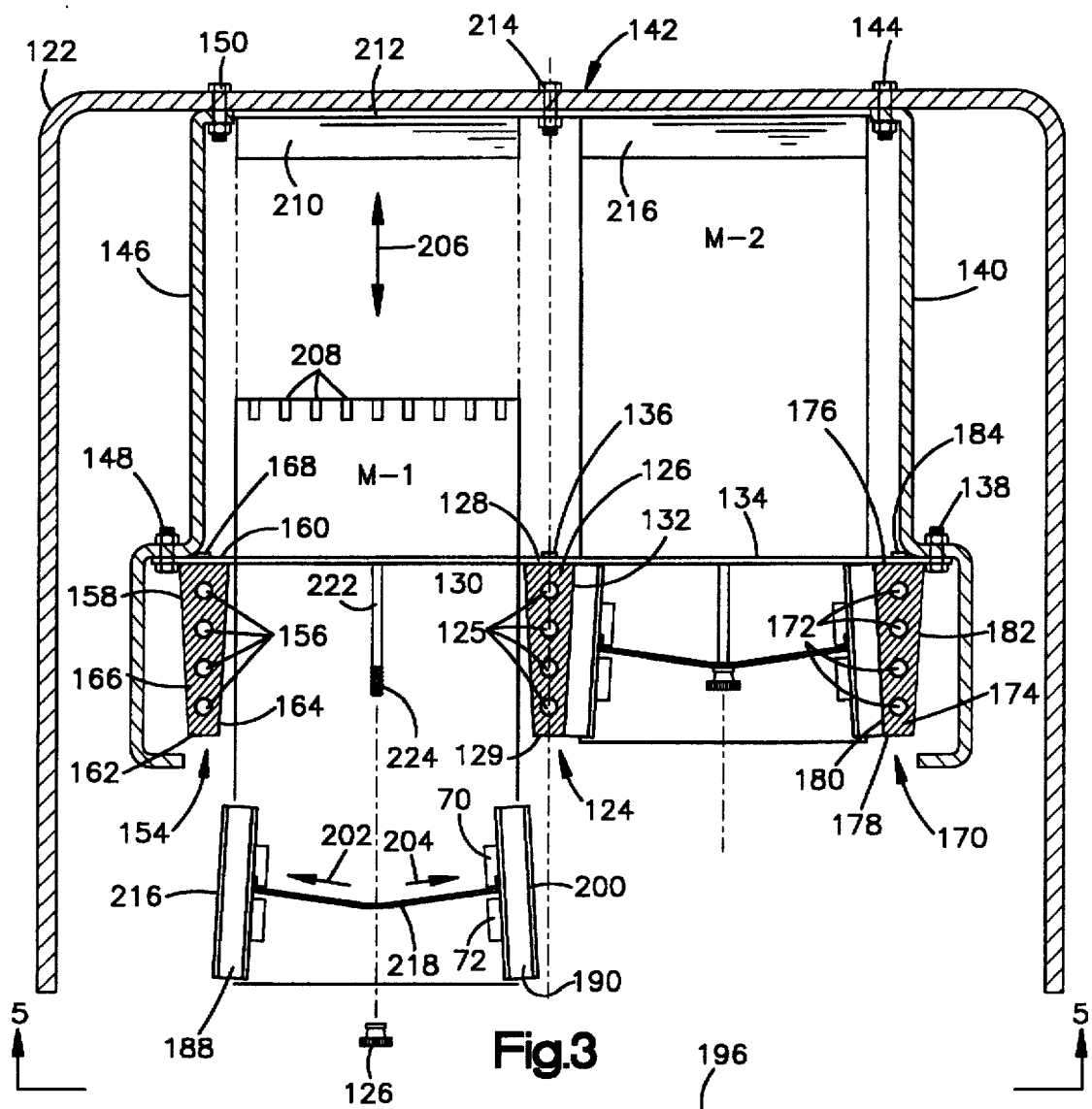
FIG. 3 is a cross-sectional top view of a typical cabinet housing a liquid cooling system for cooling the RF power amplifiers described in FIG. 2.

With reference to FIG. 3, a cross-sectional top view of a liquid cooling system 120 in accordance with the present invention is shown for cooling the RF power amplifiers $PA_1$-$PA_N$. The liquid cooling system 120 includes a cabinet 122 which houses the RF power amplifiers $PA_1$-$PA_N$. An AM broadcast transmitter may consist of several such cabinets 122. A center liquid cooled plate 124 is positioned in the center of the cabinet 122 so that the plate extends lengthwise along the vertical length of the cabinet. The center liquid cooled plate 124 comprises four liquid coolant pipes 125 which run through the center of a thermally conductive block 126. These liquid coolant pipes 125 facilitate the flow of a liquid coolant and will be discussed in more detail below.

The thermally conductive block 126 has two ends 128 and 129, and two angled sides 130 and 132. The sides 130 and 132 are angled such that the block 126 is thicker at the end 128 than at the opposite end 129. The end 128 of the block 126 is secured to a front plate 134 through a plurality of screws 136 positioned along the vertical length of the cabinet 122. A screw 138 secures one end of the front plate 134 to a metal frame section 140. This metal frame section 140 is in turn secured to the back 142 of the cabinet 122 through a plurality of screws 144 positioned along the vertical length of the cabinet. The other end of the front plate 134 is secured to another metal frame section 146 through a screw 148. This metal frame section 146 is secured to the back 142 of the cabinet 122 through a plurality of screws 150 positioned along the vertical length of the cabinet.

A first outer liquid cooled plate 154 is positioned along one side of the cabinet 122 so that the plate extends lengthwise along the vertical length of the cabinet. The outer liquid cooled plate 154 comprises four liquid coolant pipes 156 which run through a thermally conductive block 158. The thermally conductive block 158 has two ends 160 and 162, and two angled sides 164 and 166. The sides 164 and 166 are angled such that the block 158 is thicker at the end 160 than at the opposite end 162. The end 160 of the block 158 is secured to the front plate 134 through a plurality of screws 168 positioned along the vertical length of the cabinet 122.

A second outer liquid cooled plate 170 is positioned along the side of the cabinet 122 opposite the plate 154 such that the plate extends lengthwise along the vertical length of the cabinet. The outer liquid cooled plate 170 comprises four liquid coolant pipes 172 which run through a thermally conductive block 174. The thermally conductive block 174 has two ends 176 and 178, and two angled sides 180 and 182. The sides 180 and 182 are angled such that the block 174 is thicker at the end 176 than at the opposite end 178. The end 176 of the block 174 is secured to the front plate 134 through a plurality of screws 184 positioned along the vertical length of the cabinet 122.

In a preferred embodiment, the thermally conductive blocks 126, 158, and 174 are aluminum and the coolant pipes 125, 156, and 172 are copper. One skilled in the art will understand that the blocks 126, 158 and 174 may consist of other suitable materials. Likewise, the coolant pipes 125, 156, and 172 may be made of other suitable materials, and the number and diameter of such pipes may also be varied.

Each pair of amplifiers from $PA_1$-$PA_N$ is known as an RF Amplifier Module. These RF Amplifier Modules are designated M-1 to M-N. The RF Amplifier Modules M-1 to M-N are mounted in the cabinet 122 such that each module is positioned between the center liquid cooled plate 124 and one of the outer liquid cooled plates 154 and 170. For example, the module M-1 is mounted between the center liquid cooled plate 124 and the outer liquid cooled plate 154, and the module M-2 between the center liquid cooled plate and the outer liquid cooled plate 170. Each of the modules M-1 to M-N is identical, so only module M-1 will be described in detail.

Figure 4:
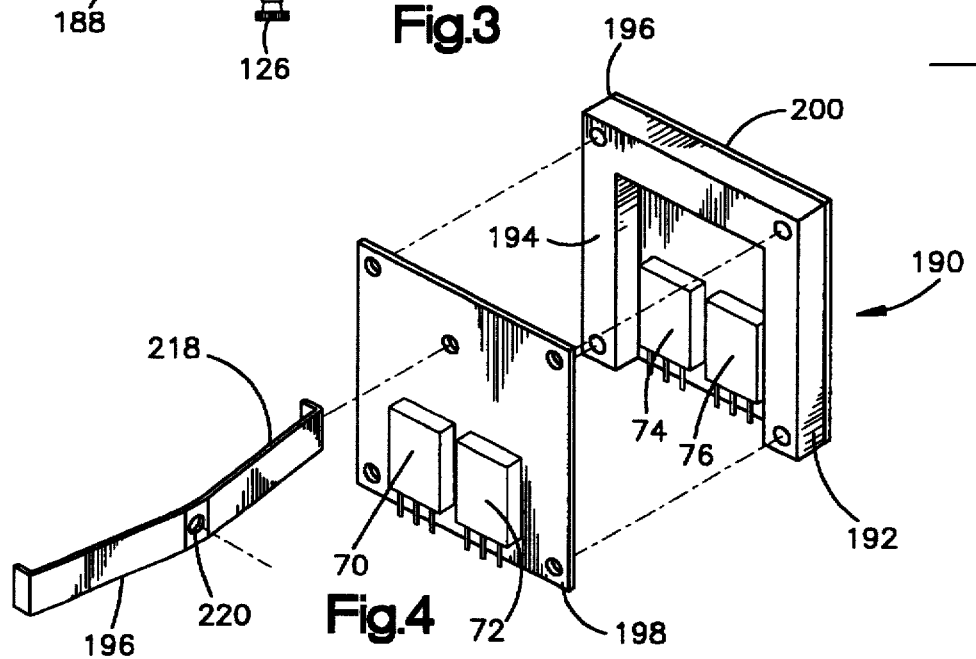
FIG. 4 is a perspective view of one of the thermally conductive blocks associated with an RF power amplifier.

The module M-1 includes a circuit board 186 to which the electronic components of the power amplifiers $PA_1$ and $PA_2$ are connected. The module M-1 also includes two heat sinks or thermally conductive blocks 188 and 190. The thermally conductive blocks 188 and 190 are secured to the circuit board 186. The blocks 188 and 190 can be secured to the circuit board 186 through methods known in the art. For example, the leads of the power MOSFETs soldered into the circuit board 186 can support the blocks 188 and 190, or screws or adhesive may also be used. Referring to FIG. 4, the thermally conductive block 190 includes a formed plate 192 having an inner side 194 and an outer side 196. A flat plate 198 is mounted using screws to the inner side 194 of the formed plate 192. A thermally conductive pad 200 is disposed on the outer side 196 of the formed plate 192. This thermally conductive pad 200 is formed from a material which has the characteristic that it compresses under pressure and expands as temperature increases. The thermally conductive blocks 188 and 190 are preferably made of aluminum, but one skilled in the art will understand that other thermally conductive materials may also be utilized.

The power MOSFETs 70, 72, 74 and 76 of the power amplifier $PA_1$ are mounted to the thermally conductive block 190. As shown, the MOSFETs 70 and 72 are mounted to the flat plate 198 and the MOSFETs 74 and 76 are mounted to the formed plate 192. The power MOSFETs of the power amplifier $PA_2$ are mounted to the thermally conductive block 188. Between each MOSFET and the block to which it is mounted is placed a "CAPTON" pad, which is a thermally conductive and electrically isolating pad. In this way, the heat generated by the power MOSFETs associated with the power amplifiers $PA_1$ and $PA_2$ is conductively transferred to the thermally conductive blocks 190 and 188, respectively.

The modules M-1 to M-N can be slid in and out of their respective positions in the cabinet 122 as indicated by the arrow 206. This allows for modules to be easily removed and inserted in the field should a module need replacement or repair. The circuit board 186 of the module M-1 has a plurality of electrical pads 208 at one end. These electrical pads 208 provide electrical connection to an edge connector 210. The edge connector 210 is mounted on and electrically connected to a back plane 212. The back plane 212 is secured to the cabinet back 142 via screws 214. The back plane 212 provides electrical interconnection among the modules M-1 to M-N.

In FIG. 3, the module M-2 is shown in its normal operating position in which it is electrically connected through an edge connector 216 to the back plane 212. The module M-1 is shown as partially inserted into its normal operating position. When the module M-1 is in its normal operating position, the thermally conductive pad 200 of the block 190 is in contact with the angled side 130 of the center liquid cooled 124. Likewise, with the module M-1 in its normal operating position the block 188 has a thermally conductive pad 216 which is in contact with the angled side 164 of the outer liquid cooled plate 154.

A spring device 218 is connected at one end to the block 188 and at the other end to the block 190. The spring device 218 is a piece of metal or other material having a suitable spring constant. A hole 220 is located at the center of the spring device 218. A post 222 is secured at one end to the front plate 134 and has at its other end a threaded end 224. When the module M-1 is in its normal operating position, the threaded end 224 runs through the hole 220. A screw cap 226 is attached to the threaded end 224 to secure the module M-1 in place. As the screw cap 226 is torqued onto the threaded end 224, the spring device 218 exerts bias forces represented by the arrows 228 and 230 against the blocks 188 and 190, respectively. The bias forces are perpendicular to the face of the blocks 188 and 190.

As a result of the bias forces, the block 188 exerts a force against the outer liquid cooled plate 154 and the block 190 exerts a force against the center liquid cooled plate 124. These forces assure adequate contact and thereby assure adequate thermal interface between the blocks 188 and 190 and the liquid cooled plates 154 and 124, respectively. In addition, the thermally conductive pads 200 and 216 further assure adequate thermal conductivity between the blocks 188 and 190 and the liquid cooled plates 154 and 124, respectively. This is true because as temperature increases, the pads 200 and 216 expand to fill any air voids between the blocks 188 and 190 and the liquid cooled plates 154 and 124, respectively.

Figure 5:
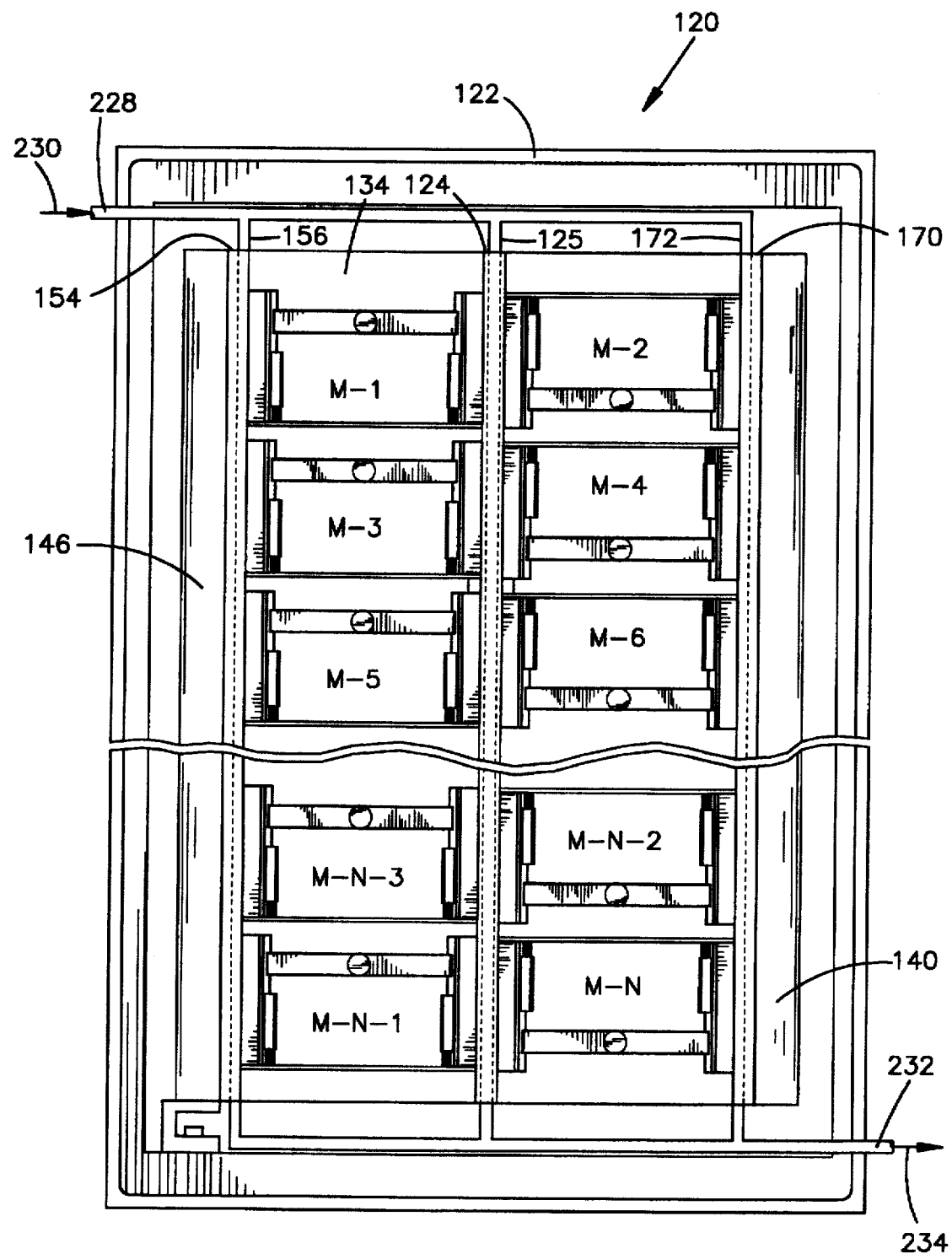
FIG. 5 is a front view of a cabinet housing the liquid cooling system of the present invention.

FIG. 5 is a frontal view of a cabinet containing the liquid cooling system 120 and showing the interconnection of the liquid coolant pipes 125, 156 and 172. At the top of the cabinet 122, a coolant pipe 228 interconnects the coolant pipes 125, 156 and 172. An arrow 230 indicates that liquid coolant flows into the coolant pipe 228 and from there downward through the liquid coolant pipes 125, 156 and 172. The liquid coolant may be water when the cabinet 122 is in a non-freezing environment and a mixture of water and antifreeze if the cabinet is placed in a freezing environment.

At the bottom of the cabinet 122 a coolant pipe 232 interconnects the liquid coolant pipes 125, 156 and 172. An arrow 234 indicates that at the bottom of the cabinet 122 the liquid coolant flows from the liquid coolant pipes 125, 156 and 172 into the coolant pipe 232 and then out of the cabinet. As the liquid coolant flows through the liquid coolant pipes 125, 156 and 172 the heat generated by the power MOSFETs associated with the power amplifiers $PA_1$-$PA_N$ contained on each module M-1 to M-N is conductively transferred to this liquid coolant. The liquid coolant flows through the coolant pipes and carries the heat away from the power MOSFETs to thereby cool the MOSFETs.

Figure 6:
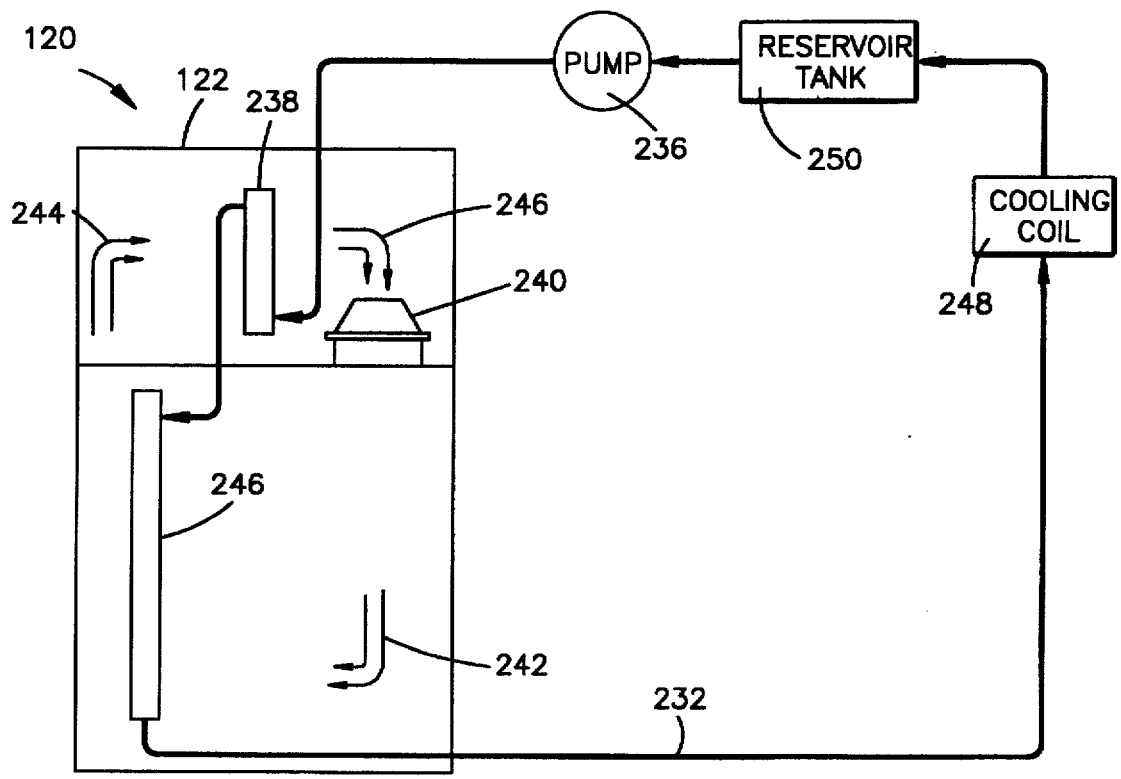
FIG. 6 is a schematic drawing of the liquid cooling system connected in a closed loop configuration for circulating liquid coolant through the system.

With reference to FIG. 6, a schematic representation of a liquid cooling system 120 in accordance with the present invention is shown for cooling the RF power amplifiers $PA_1$-$PA_N$. The cooling system 120 includes a pump 236 for pumping the liquid coolant throughout the system. The output of the pump 236 is connected to the input of a residual heating coil 238. The residual heating coil 238 is positioned in the top of the cabinet 122. In a preferred embodiment the residual heating coil 238 is a coil of pipe such as the type of coil used in common air conditioning units. A fan unit 240 blows air across the residual heat coil 238. The fan unit 240 is positioned such that air is blown across the modules M-1 to M-N as indicated by the arrows 242. This air removes heat generated by the residual electronic components (i.e., all electronic components except the power MOSFETs) contained on the modules M-1 to M-N. After blowing across the modules M-1 to M-N this heated air is directed across the residual heat coil 238 as indicated by the arrows 244. All the residual heat generated by the modules M-1 to M-N is cooled by the residual heating coil 238 and cool air indicated by arrows 246 is then directed into the fan unit 240.

The output of the residual heating coil 238 is connected to the top ends of the coolant pipes 125, 156 and 172 (i.e., to coolant pipe 228 in FIG. 5) and the liquid coolant flows through the respective liquid cooled plates. The liquid cooled plates 124, 154 and 170 are collectively designated 246. The bottom ends of the coolant pipes 125, 156 and 172 are connected together (i.e, to coolant pipe 232 in FIG. 5). The liquid flowing through the coolant pipe 232 is warm due to the heat conductively transferred to that liquid from the power MOSFETs of the various powers amplifiers $PA_1$-$PA_N$. This liquid must therefore be cooled before being again pumped through the system. The liquid coolant flows through the coolant pipe 232 and into a cooling coil 248. The cooling coil 248 removes the heat from the liquid coolant and outputs cool liquid coolant into a reservoir tank 250. The input of the pump 236 is connected to reservoir tank 250 and pumps the cooled liquid coolant from the tank through the system to cool the modules M-1 to M-N.

Figure 7:
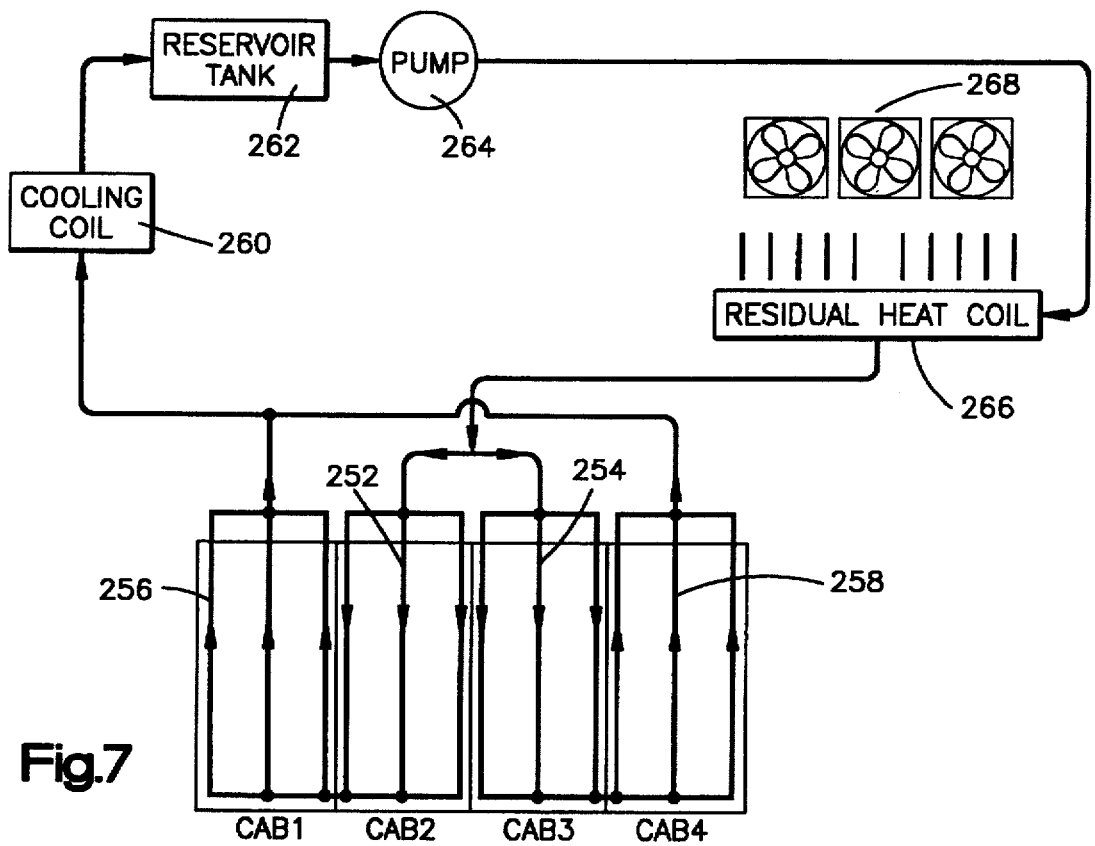
FIG. 7 is a schematic drawing of a typical transmitter including a plurality of cabinets, each containing a liquid cooling system in accordance with the present invention, and the interconnection of these systems in a closed loop configuration for circulating liquid coolant through the systems.

FIG. 7 shows the liquid coolant system 120 in an AM broadcast transmitter comprising modules M-1 to M-N which are of a sufficient number to necessitate more than one cabinet 122. In the system shown in FIG. 7, there are four cabinets designated CAB1 to CAB4. Each of these cabinets and the modules contained therein is identical to the cabinet 122 previously described. The lines illustrate the direction of the flow of liquid coolant through the liquid cooled plates contained in each cabinet. In each cabinet the center line represents the liquid coolant flowing through the center liquid cooled plate and the two outer lines represent the liquid coolant flowing through the two outer liquid cooled plates.

In the cabinets CAB2 and CAB3, liquid coolant enters at the top of each cabinet and flows downward through the respective liquid cooled plates located in each cabinet as indicated by the lines 252 and 254, respectively. At the bottom of the cabinet CAB2, the liquid coolant then is fed into the bottom of the cabinet CAB1. At the bottom of the cabinet CAB3, the liquid coolant is fed into the bottom of the cabinet CAB4. In the cabinets CAB1 and CAB4, the liquid coolant flows from the bottom of each cabinet to the top of each cabinet as indicated by the lines 256 and 258, respectively. The liquid coolant flowing out of the top of the cabinets CAB1 and CAB4 is fed into a cooling coil 260. The cooling coil 260 removes the heat transferred to the liquid coolant from the power amplifiers located in the cabinets CAB1 to CAB4.

After the liquid coolant is cooled by the cooling coil 260 the cooled liquid coolant is fed into a reservoir tank 262. A pump 264 draws the cooled liquid coolant from the reservoir tank 262 and pumps that liquid coolant into a residual heat coil 266. A fan unit 268 comprising a plurality of fans circulates air through the cabinets CAB1 to CAB4 and across the residual heat coil 266. In this way, the residual heat generated by the electronic components other than the power MOSFETs on the power amplifiers $PA_1$–$PA_N$ is removed from the cabinets and transferred to the liquid coolant flowing through the residual heat coil 266. Notice that as schematically depicted there is only one residual heat coil 266 and one fan unit 268 for the four cabinets CAB1 to CAB4. Appropriate air ducts as are known in the art direct the air flow through the four cabinets CAB1 to CAB4 so that separate residual heating coils and fan units are not required for each cabinet. The liquid coolant flows through the residual heating coil 266 and into the cabinets CAB2 and CAB3 as indicated by the lines 252 and 254, respectively.

One skilled in the art will realize that while the liquid cooling system of the present invention has been described with reference to an AM broadcast transmitter, such a liquid cooling system can also be utilized in FM, TV, and other types of transmitters as well.

From the above description of the invention, those skilled in the art will perceive improvements, changes and modifications. Such improvements, changes and modifications within the skill of the art are intended to be covered by the appended claims.

Having described the invention, we claim the following:

1. A liquid cooling system apparatus for removing heat generated by a power amplifier, comprising:

a power amplifier characterized in that it generates heat;

a thermally conductive block mounted to said power amplifier such that said block dissipates heat generated by said power amplifier;

a liquid cooled plate having a thermal block and at least one coolant pipe running through the thermal block, said coolant pipe containing a liquid coolant flowing through said pipe; and means for resiliently biasing said thermally conductive block against said thermal block of said liquid cooled plate so that the heat generated by said power amplifier is conductively transferred from said amplifier to the liquid coolant flowing through the at least one coolant pipe.

2. An apparatus as recited in claim 1 wherein said liquid coolant is water.

3. An apparatus as recited in claim 1 wherein said liquid coolant is a mixture of antifreeze and water.

4. An apparatus as recited in claim 1 wherein said thermally conductive block of said power amplifier and said thermal block of said liquid cooled plate are made of aluminum.

5. A liquid cooling system apparatus for removing heat generated by a power amplifier, comprising:

a power amplifier characterized in that it generates heat;

a thermally conductive block having an inner planar side and an outer planar side, said power amplifier being mounted to the inner planar side of said thermally conductive block such that said thermally conductive block dissipates heat generated by said power amplifier;

a liquid cooled plate including a thermal block having two planar sides, and further including at least one coolant pipe running through the thermal block, said coolant pipe containing a liquid coolant flowing through said coolant pipe;

means for resiliently biasing the outer planar side of said thermally conductive block against one of the planar sides of said thermal block of said liquid cooled plate such that the heat generated by said power amplifier is conductively transferred from said amplifier to the liquid coolant flowing through the at least one coolant pipe;

and means for removably securing said conductive block against said thermal block.

6. A liquid cooling system apparatus for removing heat generated by a power amplifier, comprising:

a power amplifier characterized in that it generates heat;

a thermally conductive block having an inner planar side and an outer planar side, said power amplifier being mounted to the inner planar side of said thermally conductive block such that said thermally conductive block dissipates heat generated by said power amplifier;

a liquid cooled plate including a thermal block having two planar sides, and further including at least one coolant pipe running through the thermal block, said coolant pipe containing a liquid coolant flowing through said coolant pipe;

means for biasing the outer planar side of said thermally conductive block against one of the planar sides of said thermal block of said liquid cooled plate such that the heat generated by said power amplifier is conductively transferred from said amplifier to the liquid coolant flowing through the at least one coolant pipe;

a thermally conductive pad disposed on the outer planar side of said thermally conductive block, said thermally conductive pad having the characteristic that as temperature increases the thermally conductive pad expands.

7. An apparatus as recited in claim 6 wherein said liquid coolant is water.

8. An apparatus as recited in claim 6 wherein said liquid coolant is a mixture of antifreeze and water.

9. An apparatus as recited in claim 6 wherein said thermally conductive block and said thermal block of said liquid cooled plate are made of aluminum.

10. A liquid cooling system apparatus for removing heat generated by a plurality of radio frequency(RF) power amplifiers contained in a high power AM broadcast transmitter, comprising:

a cabinet having a vertical length, a front and a back, and two sides for housing the RF power amplifiers and liquid cooling system;

a center liquid cooled plate comprising a thermal block having two parallel planar sides and a length, and four coolant pipes running through the thermal block parallel to the planar sides, said four coolant pipes containing a liquid coolant flowing through said four coolant pipes, said center liquid cooled plate being positioned in the center of said cabinet such that the length of said thermal block runs along the vertical length of said cabinet;

a first side liquid cooled plate comprising a thermal block having two parallel planar sides and a length, and four coolant pipes running through the thermal block parallel to the planar sides, said four coolant pipes containing a liquid coolant flowing through said four coolant pipes, said first side liquid cooled plate being positioned on one side of said cabinet such that the length of said thermal block runs along the vertical length of said cabinet;

a second side liquid cooled plate comprising a thermal block having two parallel planar sides and a length, and four coolant pipes running through the thermal block parallel to the planar sides, said four coolant pipes containing a liquid coolant flowing through said four coolant pipes, said second side liquid cooled plate being positioned on the other side of said cabinet such that the length of said thermal block runs along the vertical length of said cabinet;

a pump operatively connected to the liquid coolant pipes of said center liquid cooled plate, said first side liquid cooled plate, and said second side liquid cooled plate for pumping the liquid coolant through the liquid coolant pipes;

a plurality of RF power amplifiers, each RF power amplifier including four power MOSFET transistors for providing a high power output from said amplifier, and each of said power MOSFET transistors characterized in that it generates heat, said RF power amplifiers further including a thermally conductive block having an inner side and an outer side and said power MOSFET transistors being physically mounted to the inner side said thermally conductive block so that heat generated by each power MOSFET transistor is conductively transferred to the thermally conductive block to which the power MOSFET transistor is mounted;

a plurality of RF modules, each of said RF modules comprising a circuit board having a planar side, a front and back edge, and two side edges where two of said RF power amplifiers are contained on said planar side of said RF module, and each of the thermally conductive blocks is mounted to said circuit board so that its outer side is parallel to the side edges of said circuit board;

means for mounting each RF module between one of said center liquid cooled plate and said first side liquid cooled plate and said center liquid cooled plate and said second side liquid cooled plate, each said RF module being mounted such that the outer side of the thermally conductive block is in contact with one of the planar side of said center liquid cooled plate, and said outer side of the other thermally conductive block is in contact with one of the planar sides of at least one of the first side liquid cooled plate and said second side liquid cooled plate;

means for biasing each said thermally conductive block against the liquid cooled plate with which it is in contact so that the heat transferred to each thermally conductive block from the power MOSFETs mounted on that block is conductively transferred to the liquid coolant plate with which the block is in contact.

11. An apparatus as recited in claim 10 wherein said means for biasing is a piece of resilient material having a desired spring constant, said piece of resilient material having two ends, and each RF module having said piece of resilient material positioned between the two thermally conductive blocks contained on the RF module, one end of said piece of resilient material being attached to the inner side of one of said thermally conductive blocks and the other end of said piece of resilient material being attached to the inner side of the other one of said thermally conductive blocks.

12. An apparatus as recited in claim 11 wherein said piece of resilient material is made of beryllium copper.

13. An apparatus as recited in claim 10 wherein each of said liquid cooled plates has a front side and a back side and a thickness, said front side of each of said liquid cooled plates being positioned near the front of said cabinet and the back side positioned near the back of said cabinet, said thickness of each of said liquid cooled plates being smaller at said front side of said liquid cooled plates than the thickness at said back side of said liquid cooled plates such that the parallel sides of each of said liquid cooled plates is angled, said thermally conductive blocks being mounted on the circuit board of the associated RF module so that the outer side of each of the thermally conductive blocks is angled by the same amount as the parallel side of the liquid cooled plate with which a particular thermally conductive block is in contact.

* * * * *